United States Patent
Ang et al.

(10) Patent No.: US 6,610,575 B1
(45) Date of Patent: Aug. 26, 2003

(54) FORMING DUAL GATE OXIDE THICKNESS ON VERTICAL TRANSISTORS BY ION IMPLANTATION

(75) Inventors: Chew-Hoe Ang, Singapore (SG); Eng-Hua Lim, Singapore (SG); Cher-Liang Cha, Singapore (SG); Jia-Zhen Zheng, Singapore (SG); Elgin Quek, Singapore (SG); Mei-Sheng Zhou, Singapore (SG); Daniel Yen, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 10/161,818

(22) Filed: Jun. 4, 2002

(51) Int. Cl.[7] ............................. H01L 21/8234
(52) U.S. Cl. ........................................ 438/275
(58) Field of Search ............... 438/270, 272, 438/273–275

(56) References Cited

U.S. PATENT DOCUMENTS

| | | | |
|---|---|---|---|
| 5,324,673 A | 6/1994 | Fitch et al. ................ 437/40 |
| 5,757,038 A | 5/1998 | Tiwari et al. ............ 257/192 |
| 6,013,548 A | 1/2000 | Burns, Jr. et al. ........ 438/242 |
| 6,030,871 A | 2/2000 | Eitan ......................... 438/276 |
| 6,077,745 A | 6/2000 | Burns, Jr. et al. ........ 438/270 |
| 6,080,682 A | 6/2000 | Ibok ........................... 438/770 |
| 6,150,670 A | 11/2000 | Faltermeier et al. ........ 257/77 |
| 6,258,673 B1 * | 7/2001 | Houlihan et al. .......... 438/275 |
| 6,440,801 B1 * | 8/2002 | Furukawa et al. ......... 438/272 |
| 2002/0102827 A1 * | 8/2002 | Chen ........................... 438/584 |

* cited by examiner

Primary Examiner—Wael Fahmy
Assistant Examiner—Aneta Cieslewicz
(74) Attorney, Agent, or Firm—George O. Saile; Rosemary L. S. Pike; Stephen G. Stanton

(57) ABSTRACT

A method of structures having dual gate oxide thicknesses, comprising the following steps. A substrate having first and second pillars is provided. The first and second pillars each having an outer side wall and an inner side wall. At least one of the outer or inner side walls of at least one of the first and second pillars is/are masked leaving at least one of the outer or inner side walls of at least one of the first and second pillars exposed. Dopants are then implanted through the at least one of the exposed outer or inner side walls modifying the surface of the at least one of the doped exposed outer or inner side walls. The at least one of the masked outer or inner side walls of at least one of the first and second pillars is/are unmasked. Gate oxide is grown on the outer side walls and the inner side walls of the first and second pillars wherein the gate oxide grown upon the modified surfaces of the at least one of the doped outer or inner side walls is thicker than the gate oxide grown upon the non-modified surfaces of the at least one of the non-doped outer or inner side walls.

47 Claims, 4 Drawing Sheets

FORMING DUAL GATE OXIDE THICKNESS ON VERTICAL TRANSISTORS BY ION IMPLANTATION

BACKGROUND OF THE INVENTION

One way to increase chip packing density is to make vertical transistors. However, vertical transistor fabrication elevates the complexity of the process steps and conditions. This complexity is magnified when vertical transistors are fabricated with different gate oxide thicknesses for higher levels of circuitry integration which makes the task even more challenging and demanding.

U.S. Pat. No. 5,757,038 to Tiwari et al. describes a self-aligned dual gate MOSFET with an ultra-narrow channel.

U.S. Pat. Nos. 6,013,548 and 6,077,745 each to Burns, Jr. et al. both describe a method of fabricating self-aligned diffused source vertical transistors with deep trench capacitors in a 4F-square memory cell array.

U.S. Pat. No. 5,324,673 to Fitch et al. describes a method of fabricating vertical transistors U.S. Pat. No. 6,030,871 to Eitan describes a method of manufacturing two bit ROM cell using an angled implant.

U.S. Pat. No. 6,080,682 to Ibok describes a methodology for achieving dual gate oxide thicknesses.

U.S. Pat. No. 6,150,670 to Faltermeier et al. describes a process for fabricating a uniform gate oxide of a vertical transistor.

SUMMARY OF THE INVENTION

Accordingly, it is an object of one or more embodiments of the present invention to provide an improved method of fabricating vertical transistors having different gate oxide thicknesses.

Another object of one or more embodiments of the present invention to provide an improved method of fabricating vertical transistors having different gate oxide thicknesses by the use of selective ion implantation.

A further object of one or more embodiments of the present invention to provide an improved method of fabricating vertical transistors having different gate oxide thicknesses by the use of selective plasma doping.

Other objects will appear hereinafter.

It has now been discovered that the above and other objects of the present invention may be accomplished in the following manner. Specifically, a substrate having first and second pillars is provided. The first and second pillars each having an outer side wall and an inner side wall. At least one of the outer or inner side walls of at least one of the first and second pillars is/are masked leaving at least one of the outer or inner side walls of at least one of the first and second pillars exposed. Dopants are then implanted through the at least one of the exposed outer or inner side walls modifying the surface of the at least one of the doped exposed outer or inner side walls. The at least one of the masked outer or inner side walls of at least one of the first and second pillars is/are unmasked. Gate oxide is grown on the outer side walls and the inner side walls of the first and second pillars wherein the gate oxide grown upon the modified surfaces of the at least one of the doped outer or inner side walls is thicker than the gate oxide grown upon the nonmodified surfaces of the at least one of the non-doped outer or inner side walls.

BRIEF DESCRIPTION OF THE DRAWINGS

The features and advantages of the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

Unless otherwise specified, all structures, layers, etc. may be formed or accomplished by conventional methods known in the prior art.

Initial Structure

Figure 1:
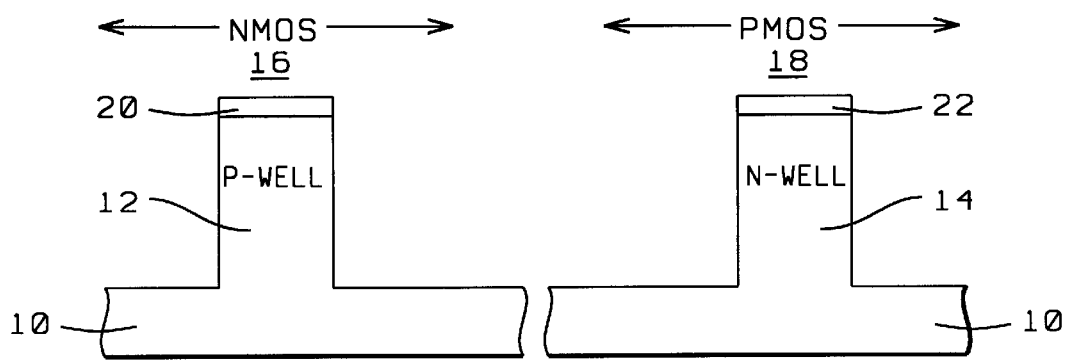
FIG. 1 schematically illustrates in cross-sectional representation a starting structure common to both embodiments of the present invention.

FIG. 1 illustrates a cross-sectional view of a substrate 10, preferably a semiconductor silicon (Si) substrate, having first 12 and second 14 pillars formed within NMOS and PMOS areas 16, 18, respectively. One of the pillars 12 has a P-well implant (P-well pillar 12 in FIG. 1 within NMOS area 16) and the other of the pillars 14 has a N-well implant (N-well pillar 14 in the FIG. 1 within PMOS area 18). It is noted that instead, pillar 12 may have an N-well implant within a PMOS area 16 and pillar 14 may have a P-well implant within an NMOS area 18. Pillars 12, 14 are preferably from about 0.1 to 1.0 μm thick.

First and second pillars 12, 14 having capping, or hard mask, layers 20, 22 formed thereover, respectively, to a thickness of from about 500 to 1000 Å. First and second hard capping layers 20, 22 are preferably formed of nitride, silicon nitride ($Si_3N_4$), oxide, a nitride/oxide stack or a silicon nitride/oxide stack and is more preferably formed of a nitride/oxide stack. First Embodiment—FIGS. 1 and 2 to 6

Figure 2:
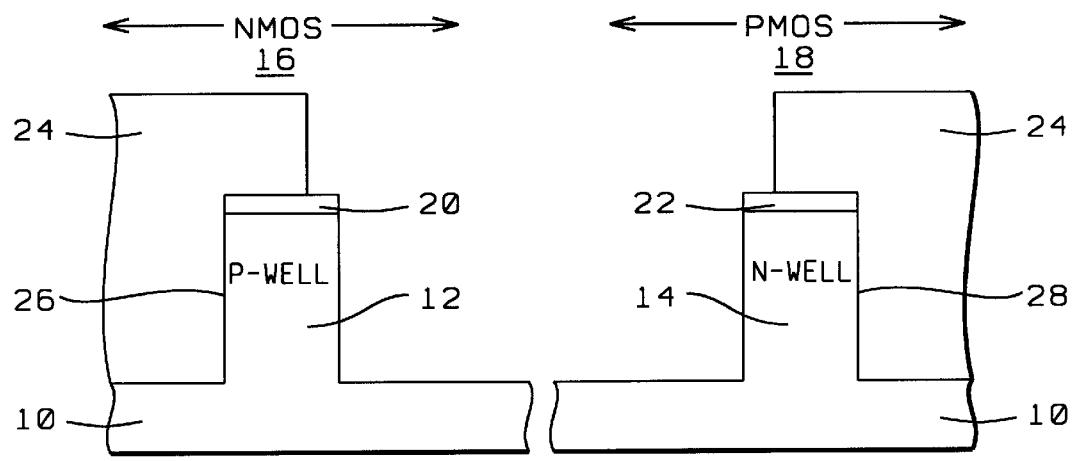
FIGS. 2 to 6 schematically illustrate, in conjunction with FIG. 1, in cross-sectional representation a first preferred embodiment of the present invention.
Figure 3:
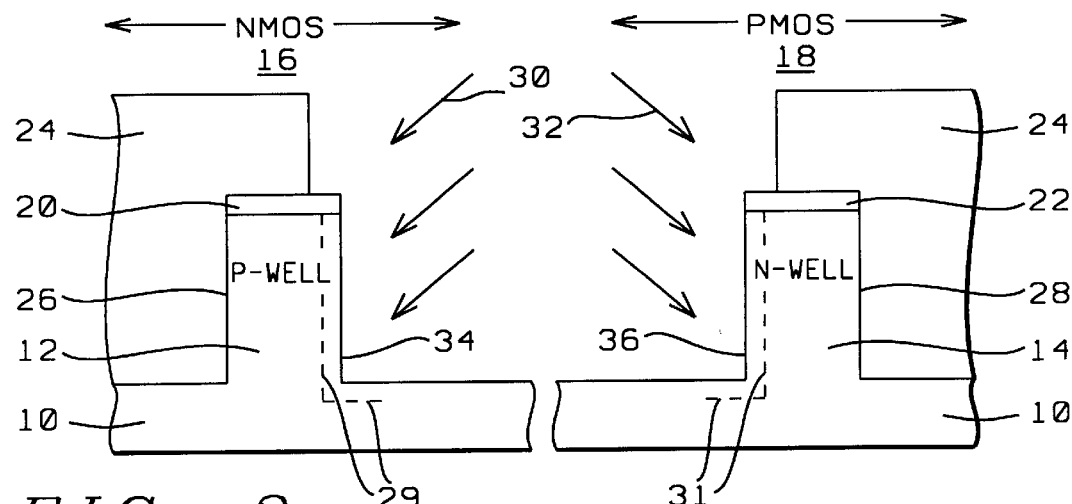

As shown in FIG. 2, first and second masks 24 are formed over at least part of first and second pillars 12, 14, respectively. FIG. 2 illustrates having: first mask 24 formed over the outer side wall 26 of P-well pillar 12 and a portion of first capping layer 20; and second mask 24 formed over the outer side wall 28 of N-well pillar 14 and a portion of second capping layer 22.

First and second masks 24 are preferably formed of deep ultraviolet (DUV) photoresist.

Tilt/Angular Ion Implantation or Remote Plasma Doping of Exposed Portions of First and Second Pillars 12, 14

In a key step of the invention, dopants 29, 31 are then implanted into the exposed inner side walls 34, 36 of partially masked P-well and N-well pillars 12, 14, respectively, and a portion of substrate 10 adjacent exposed inner side walls 34, 36 by preferably either a wide tilt/angular ion implantation or remote plasma doping 30, 32. It is noted that the remote plasma doping technique can be better than the alternate tilt/angular ion implantation due to non-dependency to features aspect ratio and layout density.

Dopants 29, 31 are preferably Si, O, N, Ge, Ar or F and are more preferably Ar or F.

The concentration of dopants 29, 31 is preferably from about $0.1 \times 10^{15}$ to $2 \times 10^{15}$ atoms/cm$^2$ and is more preferably about $1 \times 10^{15}$ atoms/cm$^2$. Dopants 29, 31 are preferably implanted from about 10 to 30 Å beneath the respective surfaces and are more preferably implanted about 10 Å beneath the respective surfaces.

The intention of doping 30, 32 the selected exposed Si side walls 34, 36 and the respective adjacent portions of Si substrate 10 is to modify the Si surfaces so that they possess different surface energies as well as different interfaces from the undoped Si surfaces for the subsequent silicon oxide (SiO$_2$ or just oxide) growth (see below).

Removal of First and Second Masks 22. 24

Figure 4:
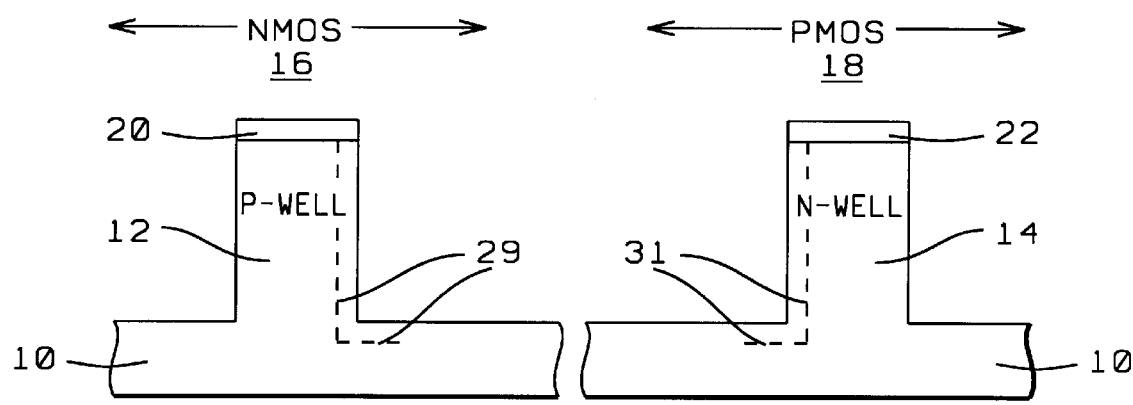

As shown in FIG. 4, first and second masks 24 are removed from first and second pillars 12, 14, respectively.

Thermal Oxidation to Grow Gate Oxide Portions 40, 44; 42, 46

Figure 5:
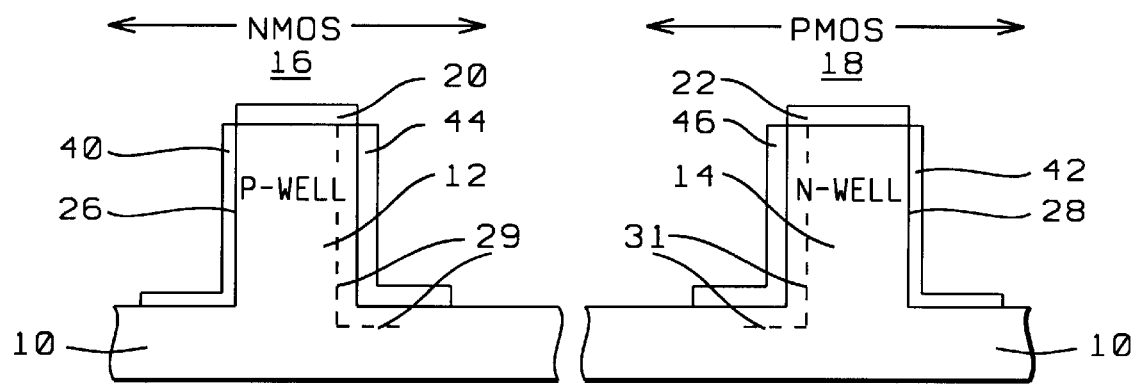

As shown in FIG. 5, a thermal oxidation process is used to grow first and second thinner gate silicon oxide (gate oxide) portions 40, 42 on the previously masked outer side walls 26, 28 et al. of first and second pillars 12, 14, respectively, and first and second thicker gate silicon oxide portions 44, 46 over doped inner side walls 34, 36 of first and second pillars 12, 14, respectively. The thermal oxidation may be carried out using either a furnace or a rapid thermal system.

As noted above, the doping 29, 31 of the selected exposed side walls 34, 36 et al. of Si modified the Si surfaces so that they possessed different surface energies as well as different interfaces from the undoped Si surfaces, e.g. i.e. outer side walls 26, 28 et al., for this gate oxide growth. This provides the difference in thicknesses between thinner gate oxide portions 40, 42 and thicker gate oxide portions 44, 46 formed on first and second pillars 12, 14, respectively.

Thinner gate oxide portions 40, 42 are preferably from about 20 to 100 Å thick, more preferably from about 20 to 50 Å thick and most preferably from about 20 to 30 Å thick. Thinner gate oxide portions 40, 42 may be grown as thin as from about 10 to 20 Å.

Thicker gate oxide portions 44, 46 are preferably from about 30 to 100 Å thick, more preferably from about 30 to 60 Å thick and most preferably from about 40 to 50 Å thick. Thicker gate oxide portions 44, 46 may be grown as thin as from about 30 to 40 Å and as thick as from about 60 to 200 Å.

Removal of Capping Layers 20, 22/Self-Aligned Source/Drain Formation

Figure 6:
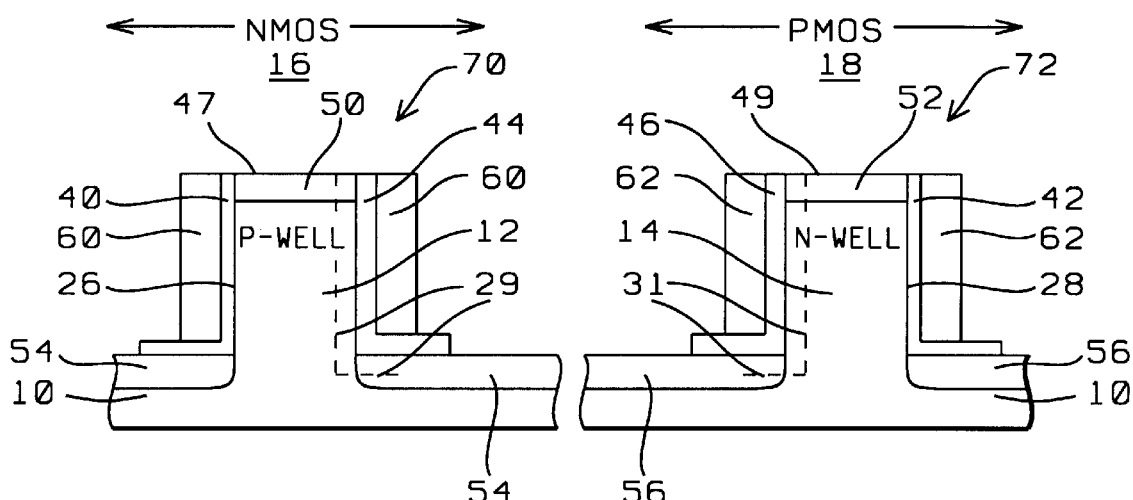

As shown in FIG. 6, first and second capping layers 20, 22 are removed from first and second pillars 12, 14, respectively, exposing the top surfaces 47, 49 of first and second pillars 12, 14, respectively.

Source implants 50, 52 are formed by self-aligned ion implantation through the exposed top portions 47, 49 of first and second pillars 12, 14. Drain implants 54, 56 are formed by self-aligned ion implantation at the base of, and extending from, first and second pillars 12, 14, respectively.

Gate regions 60, 62 are then formed proximate the thinner gate oxide portions 40, 42 and thicker gate oxide portions 44, 46, respectively, of first and second pillars 12, 14, respectively. Gate regions 60, 62 are preferably comprised of polysilicon, doped polysilicon (for control of the gate work function), tungsten, tungsten-silicon alloys, or aluminum and are more preferably doped polysilicon (for control of the gate work function).

This completes the fabrication of two vertical transistors, NMOS transistor 70 and PMOS transistor 72, each having differing gate oxide 40, 44; 42, 46, respectively, thicknesses.

Second Embodiment—FIGS. 1 and 7 to 11

The second embodiment of the present invention is illustrated in FIGS. 1, and 7 through 11 in which an ion implantation is performed in only one of the first and second pillars 12, 14. Although FIGS. 7 through 11 illustrate performing an ion implantation only into second N-well pillar 14, it is possible to perform an ion implantation only into first P-well pillar 12.

Masking of First or Second Pillars 12,14

Figure 7:
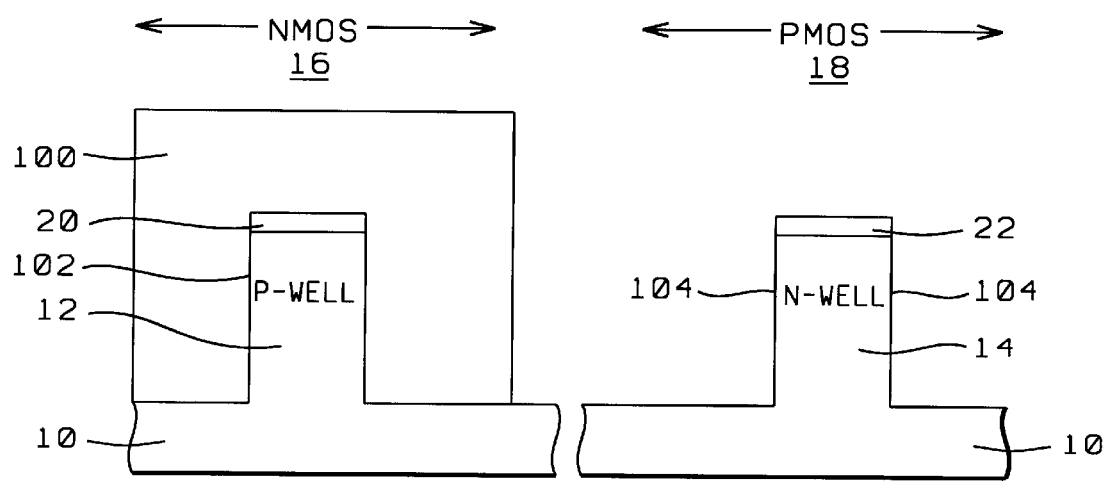
FIGS. 7 to 11 schematically illustrate, in conjunction with FIG. 1, in cross-sectional representation a second preferred embodiment of the present invention.
Figure 8:
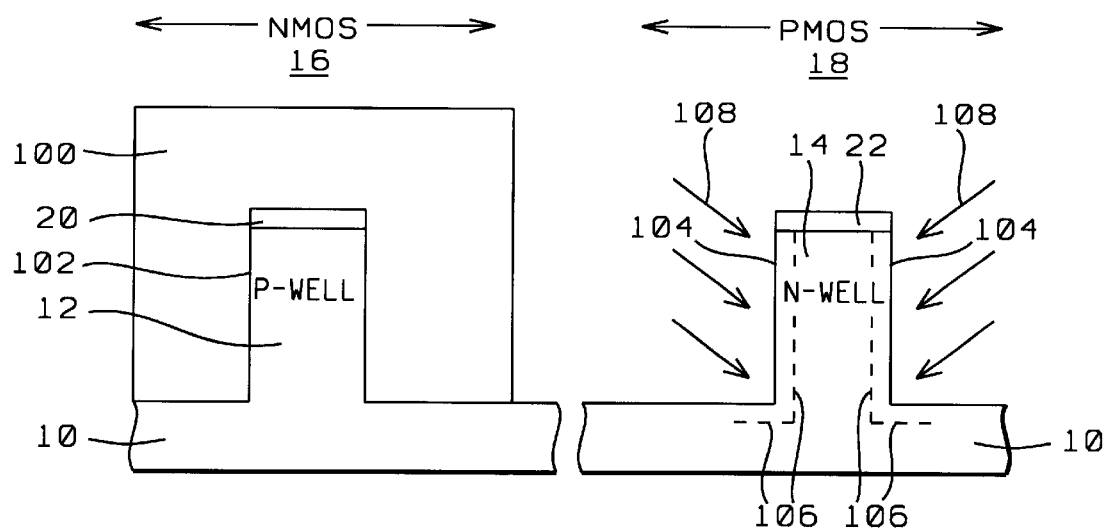

As shown in FIG. 7, one of first and second pillars 12, 14 is completely masked by mask 100. FIGS. 7 through 11 illustrate masking first P-well pillar 12 with mask 100, although second N-well pillar 14 could be likewise masked in accordance with the teachings of the present invention.

Mask 100 is formed over at least the side walls 102 of first pillar 12 with the side walls 102 and second capping layer 22 of second pillar 14 being left exposed. FIG. 7 illustrates mask 100 also being formed over first capping layer 20.

Mask 100 is preferably formed of DUV resist.

Tilt/Angular Ion Implantation or Remote Plasma Doping of Exposed Portions of Second Pillar 14

In a key step of the invention, dopants 106 are then implanted into the exposed side walls 104 of second N-well pillar 14 and a portion of substrate 10 adjacent exposed side walls 104 of second N-well pillar 14 by preferably either a tilt/angular ion implantation or remote plasma doping 108. It is noted that the remote plasma doping technique can be better than the alternate tilt/angular ion implantation due to non-dependency to features aspect ratio and layout density.

Dopants 106 are preferably Si, O, N, Ge, Ar or F and are more preferably Ar or F.

The concentration of dopants 106 is preferably from about $0.1 \times 10^{15}$ to $2 \times 10^{15}$ atoms/cm$^3$ and is more preferably about $1 \times 10^{15}$ atoms/cm$^3$. Dopants 106 are preferably implanted from about 10 to 30 Å beneath the respective surfaces and are more preferably implanted about 10 Å beneath the respective surfaces.

The intention of doping 108 the exposed Si side walls 104 and the respective adjacent portions of Si substrate 10 is to modify the Si surfaces so that they possess different surface energies as well as different interfaces from the undoped Si surfaces for the subsequent gate silicon oxide (SiO$_2$ or just gate oxide) growth (see below).

Removal of Mask 100

Figure 9:
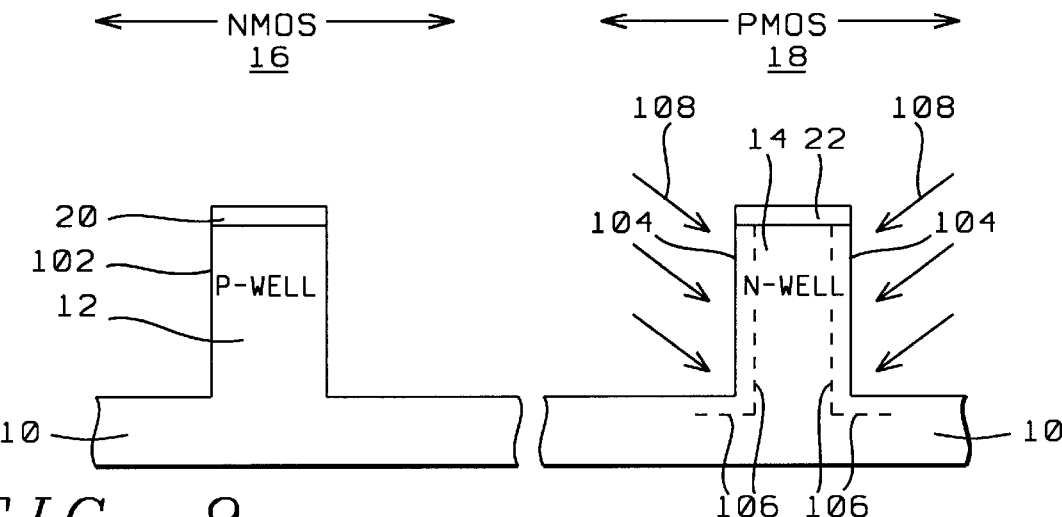

As shown in FIG. 9, mask 100 is removed from first P-well pillar 12.

Thermal Oxidation

Figure 10:
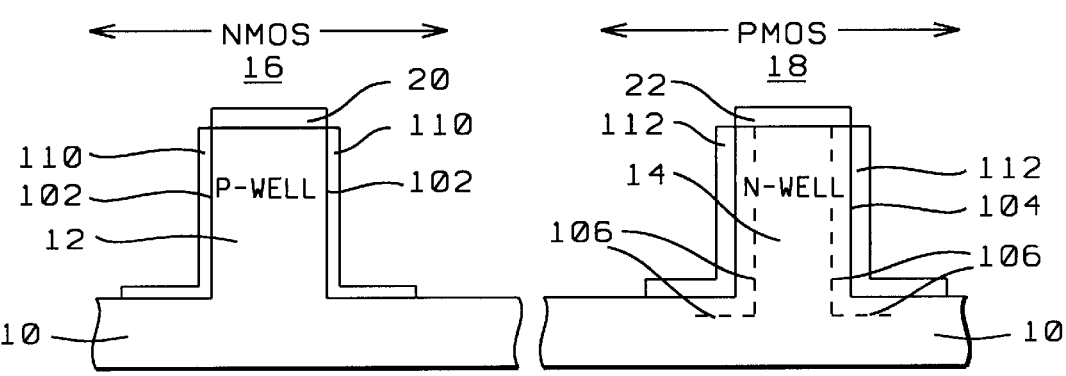

As shown in FIG. 10, a thermal oxidation process is used to grow: (1) thinner gate oxide portions 110 on the previously masked first pillar 12 side walls 102 and a portion of substrate 10 adjacent first pillar 12 side walls 102; and (2) thicker gate oxide portions 112 over doped second pillar 14 side walls 104 and a portion of substrate 10 adjacent second pillar side walls 104.

As noted above, the doping 108 of the exposed Si side walls 104 and the respective adjacent portions of Si substrate 10 modified those Si surfaces so that they possessed different surface energies as well as different interfaces from the undoped Si surfaces, first pillar side walls 102 and the respective adjacent portions of Si substrate 10 for this gate oxide growth. This provides the difference in thicknesses between thinner gate oxide portions 110 and thicker gate oxide portions 112 formed on first and second pillars 12, 14, respectively.

Thinner gate oxide portions 110 are preferably from about 20 to 100 Å thick, more preferably from about 20 to 50 Å thick and most preferably from about 20 to 30 Å thick. Thinner gate oxide portions 110 may be grown as thin as from about 10 to 20 Å.

Thicker gate oxide portions 112 are preferably from about 30 to 100 Å thick, more preferably from about 30 to 60 Å thick and most preferably from about 40 to 50 Å thick. Thicker gate oxide positions 112 may be grown as thin as from about 30 to 40 Å and as thick as from about 60 to 200 Å.

Removal of Capping Layers 20. 22/Self-Aligned Source/Drain Formation

Figure 11:
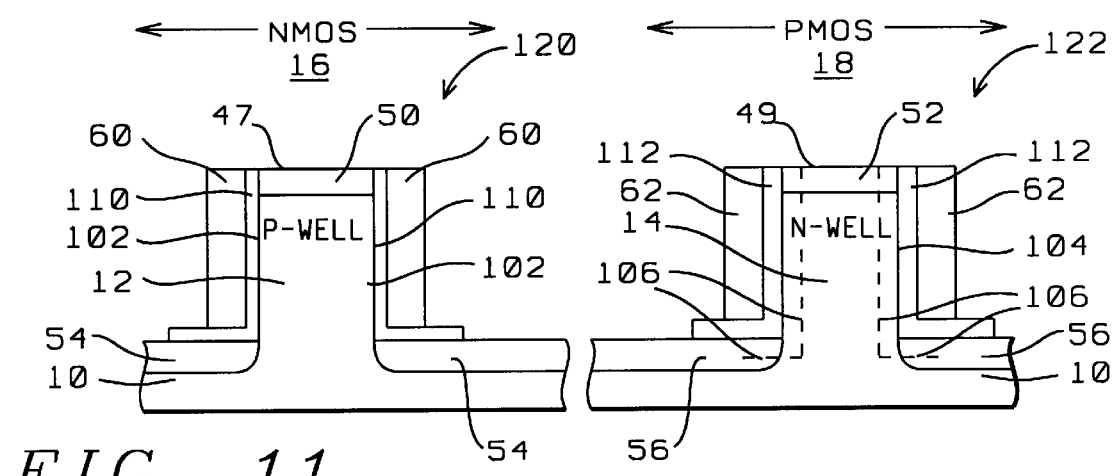

As shown in FIG. 11, first and second capping layers 20, 22 are removed from first and second pillars 12, 14, respectively, exposing the top surfaces 47, 49 of first and second pillars 12, 14, respectively.

Source implants 50, 52 are formed by self-aligned ion implantation through the exposed top portions 47, 49 of first and second pillars 12, 14. Drain implants 54, 56 are formed by self-aligned ion implantation at the base of, and extending from, first and second pillars 12, 14, respectively.

Gate regions 60 are formed proximate the thinner gate oxide portions 110 of first pillar 12, and gate regions 62 are then formed proximate the thicker gate oxide portions 112 of second pillar 14. Gate regions 60, 62 are preferably comprised of polysilicon, doped polysilicon (for control of the gate work function), tungsten, tungsten-silicon alloys, or aluminum and are more preferably doped polysilicon (for control of the gate work function).

This completes the fabrication of two vertical transistors, NMOS transistor 120 and PMOS transistor 122, having differing gate oxide 110, 112, respectively, thicknesses.

Advantages of the Invention

The advantages of one or more embodiments of the present invention include:

1) the formation of dual gate oxide on vertical transistors; or
2) the use of a remote plasma doping technique.

While particular embodiments of the present invention have been illustrated and described, it is not intended to limit the invention, except as defined by the following claims.

We claim:

1. A method of making a structure having dual gate oxide thicknesses, comprising the steps of:
   providing a substrate having first and second pillars; the first and second pillars each having an outer side wall and an inner side wall;
   masking at least one of the outer or inner side walls of at least one of the first and second pillars leaving at least one of the outer or inner side walls of at least one of the first and second pillars exposed;
   implanting dopants through the at least one of the exposed outer or inner side walls modifying the surface of the at least one of the doped exposed outer or inner side walls;
   unmasking the at least one of the masked outer or inner side walls of at least one of the first and second pillars; and
   growing gate oxide on the outer side walls and the inner side walls of the first and second pillars wherein the gate oxide grown upon the modified surfaces of the at least one of the doped outer or inner side walls is thicker than the gate oxide grown upon the non-modified surfaces of the at least one of the non-doped outer or inner side walls.

2. The method of claim 1, wherein the substrate and the first and second pillars are comprised of silicon and the grown gate oxide is silicon oxide.

3. The method of claim 1, wherein the dopants are selected from the group consisting of Si, O, N, Ge, Ar and F.

4. The method of claim 1, wherein the dopants are selected from the group consisting of Ar and F.

5. The method of claim 1, wherein the dopants are implanted by a method selected from the group consisting of a tilt/angular ion implantation method and a remote plasma doping method.

6. The method of claim 1, wherein the dopants are implanted by a remote plasma doping method.

7. The method of claim 1, wherein the dopants are implanted at a concentration of from about $0.1 \times 10^{15}$ to $2 \times 10^{15}$ atoms/cm$^2$.

8. The method of claim 1, wherein the dopants are implanted at a concentration of about $1 \times 10^{15}$ atoms/cm$^2$.

9. The method of claim 1, wherein the dopants are implanted from about 10 to 30 Å beneath the surface of the at least one of the doped outer or inner side walls.

10. The method of claim 1, wherein the dopants are implanted about 10 Å beneath the surface of the at least one of the doped outer or inner side walls.

11. The method of claim 1, wherein capping layers are formed over each of the first and second pillars before the masking step.

12. The method of claim 1, wherein capping layers are formed over each of the first and second pillars before the masking step; the capping layers being formed from a material selected from the group consisting of nitride, silicon nitride ($Si_3N_4$), oxide, a nitride/oxide stack and a silicon nitride/oxide stack.

13. The method of claim 1, wherein the gate oxide grown upon the modified surfaces of the at least one of the doped outer or inner side walls has a thickness of from about 30 to 100 Å and the gate oxide grown upon the non-modified surfaces of the at least one of the non-doped outer or inner-side walls has a thickness of from about 20 to 100 Å.

14. The method of claim 1, wherein the gate oxide grown upon the modified surfaces of the at least one of the doped outer or inner side walls has a thickness of from about 30 to 60 Å and the gate oxide grown upon the non-modified surfaces of the at least one of the non-doped outer or inner side walls has a thickness of from about 20 to 50 Å.

15. The method of claim 1, wherein gate regions are formed over the gate oxide.

16. The method of claim 1, wherein the outer side walls of the first and second pillars are masked, leaving the inner side walls of the first and second pillars exposed.

17. The method of claim 1, wherein the inner and outer side walls of one of the first and second pillars are masked, leaving the inner and outer side walls of the other pillar exposed.

18. A method of making a structure having dual gate oxide thicknesses, comprising the steps of:
providing a substrate having first and second pillars; the first and second pillars each having an outer side wall and an inner side wall;
masking the outer side walls of the first and second pillars, leaving the inner side walls of the first and second pillars exposed;
implanting dopants through the exposed inner side walls of the first and second pillars modifying the surface of the inner side walls;
unmasking the outer side walls of the first and second pillars; and
growing gate oxide on the outer side walls and the inner side walls of the first and second pillars wherein the gate oxide grown upon the modified surfaces of the doped inner side walls is thicker than the gate oxide grown upon the non-modified surfaces of the outer side walls of the first and second pillars.

19. The method of claim 18, wherein the substrate and the first and second pillars are comprised of silicon and the grown gate oxide is silicon oxide.

20. The method of claim 18, wherein the dopants are selected from the group consisting of Si, O, N, Ge, Ar and F.

21. The method of claim 18, wherein the dopants are selected from the group consisting of Ar and F.

22. The method of claim 18, wherein the dopants are implanted by a method selected from the group consisting of a tilt/angular ion implantation method and a remote plasma doping method.

23. The method of claim 18, wherein the dopants are implanted by a remote plasma doping method.

24. The method of claim 18, wherein the dopants are implanted at a concentration of from about $0.1 \times 10^{15}$ to $2 \times 10^{15}$ atoms/cm$^2$.

25. The method of claim 18, wherein the dopants are implanted at a concentration of about $1 \times 10^{15}$ atoms/cm$^2$.

26. The method of claim 18, wherein the dopants are implanted from about 10 to 30 Å beneath the surface of the doped inner side walls.

27. The method of claim 18, wherein the dopants are implanted about 10 Å beneath the surface of the doped inner side walls.

28. The method of claim 18, wherein capping layers are formed over each of the first and second pillars before the masking step.

29. The method of claim 18, wherein capping layers are formed over each of the first and second pillars before the masking step; the capping layers being formed from a material selected from the group consisting of nitride, silicon nitride ($Si_3N_4$), oxide, a nitride/oxide stack and a silicon nitride/oxide stack.

30. The method of claim 18, wherein the gate oxide grown upon the modified surfaces of the doped inner side walls has a thickness of from about 30 to 100 Å and the gate oxide grown upon the non-modified surfaces of the non-doped outer side walls has a thickness of from about 20 to 100 Å.

31. The method of claim 18, wherein the gate oxide grown upon the modified surfaces of the doped inner side walls has a thickness of from about 30 to 60 Å and the gate oxide grown upon the non-modified surfaces of the non-doped outer side walls has a thickness of from about 20 to 50 Å.

32. The method of claim 18, wherein gate regions are formed over the gate oxide.

33. A method of making a structure having dual gate oxide thicknesses, comprising the steps of:
providing a substrate having first and second pillars; the first and second pillars each having an outer side wall and an inner side wall;
masking the inner and outer side walls of one of the first and second pillars leaving the inner and outer side walls of the other pillar exposed;
implanting dopants through the exposed inner and outer side walls side walls of the other pillar modifying the surface of the inner and outer side walls side walls of the other pillar;
unmasking the inner and outer side walls of the one pillar; and
growing gate oxide on the inner and outer side walls of the first and second pillars wherein the gate oxide grown upon the modified surfaces of the doped inner and outer side walls of the other pillar is thicker than the gate oxide grown upon the non-modified surfaces of the inner and outer side walls of the one pillar.

34. The method of claim 33, wherein the substrate and the first and second pillars are comprised of silicon and the grown gate oxide is silicon oxide.

35. The method of claim 33, wherein the dopants are selected from the group consisting of Si, O, N, Ge, Ar and F.

36. The method of claim 33, wherein the dopants are selected from the group consisting of Ar and F.

37. The method of claim 33, wherein the dopants are implanted by a method selected from the group consisting of a tilt/angular ion implantation method and a remote plasma doping method.

38. The method of claim 33, wherein the dopants are implanted by a remote plasma doping method.

39. The method of claim 33, wherein the dopants are implanted at a concentration of from about $0.1 \times 10^{15}$ to $2 \times 10^{15}$ atoms/cm$^2$.

40. The method of claim 33, wherein the dopants are implanted at a concentration of about $1 \times 10^{15}$ atoms/cm$^2$.

41. The method of claim 33, wherein the dopants are implanted from about 10 to 30 Å beneath the surface of the doped inner and outer side walls of the other pillar.

42. The method of claim 33, wherein the dopants are implanted about 10 Å beneath the surface of the doped inner and outer side walls of the other pillar.

43. The method of claim 33, wherein capping layers are formed over each of the first and second pillars before the masking step.

44. The method of claim 33, wherein capping layers are formed over each of the first and second pillars before the masking step; the capping layers being formed from a material selected from the group consisting of nitride, silicon nitride ($Si_3N_4$), oxide, a nitride/oxide stack and a silicon nitride/oxide stack.

45. The method of claim 33, wherein the gate oxide grown upon the modified surfaces of the doped inner and outer side walls of the other pillar has a thickness of from about 30 to 100 Å and the gate oxide grown upon the non-modified surfaces of the non-doped inner and outer side walls of the one pillar has a thickness of from about 20 to 100 Å.

46. The method of claim 33, wherein the gate oxide grown upon the modified surfaces of the doped inner and outer side walls of the other pillar has a thickness of from about 30 to 60 Å and the gate oxide grown upon the non-modified surfaces of the non-doped inner and outer side walls 12 of the one pillar 12 has a thickness of from about 20 to 50 Å.

47. The method of claim 33, wherein gate regions are formed over the gate oxide.

* * * * *

UNITED STATES PATENT AND TRADEMARK OFFICE
CERTIFICATE OF CORRECTION

PATENT NO.    : 6,610,575 B1
DATED         : August 26, 2003
INVENTOR(S)   : Chew-Hoe Ang et al.

It is certified that error appears in the above-identified patent and that said Letters Patent is hereby corrected as shown below:

<u>Title page,</u>
Item [75], Inventors, delete "Cher-Liang Cha, Singapore (SG)", and replace with
-- Randall Cher-Liang Cha, Singapore (SG) --.

Signed and Sealed this

Second Day of December, 2003

JAMES E. ROGAN
*Director of the United States Patent and Trademark Office*